United States Patent [19]
Roberts

[11] 4,038,540
[45] July 26, 1977

[54] QUADRATURE CORRELATION PULSE DETECTOR

[75] Inventor: James L. Roberts, Seattle, Wash.

[73] Assignee: Honeywell Inc., Minneapolis, Minn.

[21] Appl. No.: 678,016

[22] Filed: Apr. 19, 1976

[51] Int. Cl.[2] .................... G06F 15/34; G01S 9/23
[52] U.S. Cl. ........................ 235/181; 325/323; 329/124; 343/7.7
[58] Field of Search ............ 235/181, 150.53; 340/146.2; 325/473–477, 320–325; 179/1 P; 329/104–107, 112, 124; 343/17.1, 17.2, 17.5, 7.7

[56] References Cited
U.S. PATENT DOCUMENTS

| | | | |
|---|---|---|---|
| 3,843,931 | 10/1974 | Sarkilahti | 325/320 |
| 3,881,101 | 4/1975 | Pederson et al. | 235/181 |
| 3,925,732 | 12/1975 | Tanaka et al. | 325/325 |
| 3,927,405 | 12/1975 | Poinsard et al. | 343/17.2 R |

Primary Examiner—Felix D. Gruber

[57] ABSTRACT

Digital apparatus and a method are disclosed for detecting a tone pulse of known carrier frequency in a signal in which random noise is present by correlating a clipped version of the input signal with a square wave reference signal having a repetition rate equal to the carrier frequency. Correlation is accomplished by multiplying the clipped input signal with each of quadrature components of the square wave reference signal and sampling the product signals to provide binary sample trains which are supplied to a pair of shift register accumulators. Reversible counters and associated logic determine the differences in the numbers of samples of noncorresponding binary values in each of the shift registers, and provide counts which are added to produce a moving correlation signal which indicates presence of a tone pulse when it exceeds a predetermined correlation threshold.

12 Claims, 5 Drawing Figures

QUADRATURE CORRELATION PULSE DETECTOR

BACKGROUND OF THE INVENTION

The present invention relates generally to signal detection, and more specifically to apparatus and techniques employing quadrature correlation to detect signal pulses in the presence of random noise.

Signal pulses of a known carrier frequency and width are employed in a variety of situations for communication, object detection and/or object location, as well as other purposes. To the extent that the signal pulses remain relatively undistorted and of a significantly higher amplitude than any background noise, pulse detection can be accomplished with relative ease and simplicity. However, there are many situations in which it is necessary to reliably detect tone pulses in a signal contaminated with random noise of significant amplitude relative to the tone pulse amplitude, either because of substantial attenuation of the tone pulses over the signal transmission path or because of a high level of ambient noise from any of a variety of sources. In such situations, simple amplitude and/or frequency discrimination may not provide reliable tone pulse detection, and other more sophisticated detection techniques are required.

One known general technique for improving signal detection involves correlation of two signals, one of which may be a reference signal. Both analog and digital forms of signal correlation are known. For example, U.S. Pat. No. 3,346,862 issued to I. G. Raudsep on Oct. 10, 1967 discloses an analog autocorrelation system for determining the time difference between a pair of pulse signals of common origin. The system employs weighting filter means for modifying the power spectra of the pulse signals to optimize the autocorrelation function. U.S. Pat. No. 3,646,334 issued to Ivar Wold on Feb. 29, 1972 discloses a hybrid analog/digital system in which two input signals to be correlated are sampled, the samples of one of the signals inserted into a recirculating memory time compressor, the output of the memory multiplied with the other signal, and the product signal averaged to determine correlation of the input signals.

Other known refinements in correlation techniques involve multiplication of the input signal with each of quadrature components of a reference signal. The product signals are integrated with respect to time to produce real and imaginary components of correlation of the input and reference signals. The real and imaginary components are combined in accordance with the Pythagorean theorem to produce an indication of correlation of the signals. A variation of this method is embodied in a signal processor disclosed in U.S. Pat. No. 3,878,526 issued to N. E. Pedersen on Apr. 15, 1975. As is typical of traditional quadrature demodulation and signal detection systems, the Pedersen processor is an analog system.

It is known that digital systems in general have certain inherent advantages over analog systems. Some of these are set forth in U.S. Pat. No. 3,039,094 issued to V. C. Anderson on June 12, 1972 which discloses a digital system for beam steering of a fixed transducer array. One disclosed embodiment utilizes shift register memory apparatus to accomplish beam steering.

Among the general advantages set forth for digital systems are that the digital signals produced thereby and used therein are directly compatible with digital computers, which provide great flexibility and signal processing power. Also, the use of digital signal processing provides for a normalized output characterized by a true signal-to-noise ratio rather than proportionality to either signal or noise alone. This normalization reduces the dynamic range requirements of components and circuits used in the system, since variations in background noise do not change the reference noise output of the system. Further, digital systems are minimally susceptible to errors and changes in calibration caused by aging of components and changes in operating parameters.

As also discussed in U.S. pat. No. 3,039,094, in many situations the polarity of a band-limited signal contains nearly as much information as the complete analog signal itself. This principle may be advantageously applied by dividing an input analog signal of interest into two classes determined by its instantaneous polarity, and representing it by a time series consisting of two possible voltage states. This so called "clipped signal" may be simply and conveniently produced by a clipper or clipping amplifier. The clipping level may be set to a limit desirable for subsequent digital signal processing, and the voltage states assigned values of $+1$ and $-1$ U.S. pat. No. 3,039,094 further states that "a limited signal may be represented by a sequence of individual amplitude samples providing the sampling rate is equal to or greater than twice the highest frequency in the signal". This principle and the principle of the preceding paragraph can be combined to permit the input signal to be represented by a set of binary digits, each sample having a value of $+1$ or $-1$, depending on the polarity of the input signal at the sampling instant.

The applicant has discovered that the advantages of quadrature correlation and digital signal processing utilizing clipped signals may be uniquely combined to provide a clipped quadrature correlation pulse detector and pulse detection technique. In addition to providing superior pulse detection capabilities this detector and detection technique have been found to possess characteristics and features which are particularly advantageous in making accurate and reliable phase determinations.

SUMMARY OF THE INVENTION

The applicant's unique pulse detection apparatus basically comprises clipping means and a reference signal generator for respectively hard limiting or clipping a pulsed sine wave input signal of known carrier frequency, and producing first and second quadrature related square wave signals each having a repetition rate equal to the carrier frequency. The clipped input signal and each of the first and second square wave signals are multiplied by digital multiplication means to produce first and second product signals respectively, each having first or second instantaneous values depending on the relative instantaneous amplitudes of the clipped signal and square wave signals. Sampling means is provided for sampling the product signals, and supplying the samples to moving window counter means operable to produce a moving correlation signal indicative of the sum of the differences of the numbers of samples having first and second values in each of the sample trains. The moving correlation signal is compared with a threshold reference signal to produce a pulse indication signal when the correlation threshold is exceeded. Peak detection means may also be provided for producing a peak detection signal in response to the highest peak in the moving correlation signal in excess of the correlation threshold.

The method of the applicant's invention basically comprises hard limiting a tone pulse input signal of known carrier frequency to produce a clipped signal, multiplying the clipped signal with each of first and second quadrature related square wave signals having a repetition rate equal to the carrier frequency to produce first and second product signals, each having first or second instantaneous values depending on the relative amplitudes of the clipped and first and second square wave signals. The product signals are sampled, and differences in the numbers of samples of each product signal having first and second values during a moving time interval are counted. The differences are summed to provide a moving correlation signal which is compared with a threshold reference signal to produce a pulse indication.

Accordingly, the primary object of this invention is to provide unique clipped quadrature correlation tone detection apparatus characterized by exceptional capability for detecting tone pulses in the presence of random noise.

It is a further object of this invention to provide a tone pulse detection method and apparatus utilizing clipped quadrature correlation techniques.

A further object is to provide exceptionally flexible apparatus and a technique for detecting tone pulses by digital means.

Yet a further object is to provide tone pulse detection apparatus and a technique particularly suitable for use in signal phase detection systems.

Additional objects of the invention may be ascertained from a study of the disclosure, drawings and appended claims.

DESCRIPTION OF THE PREFERRED EMBODIMENT

Figure 1:
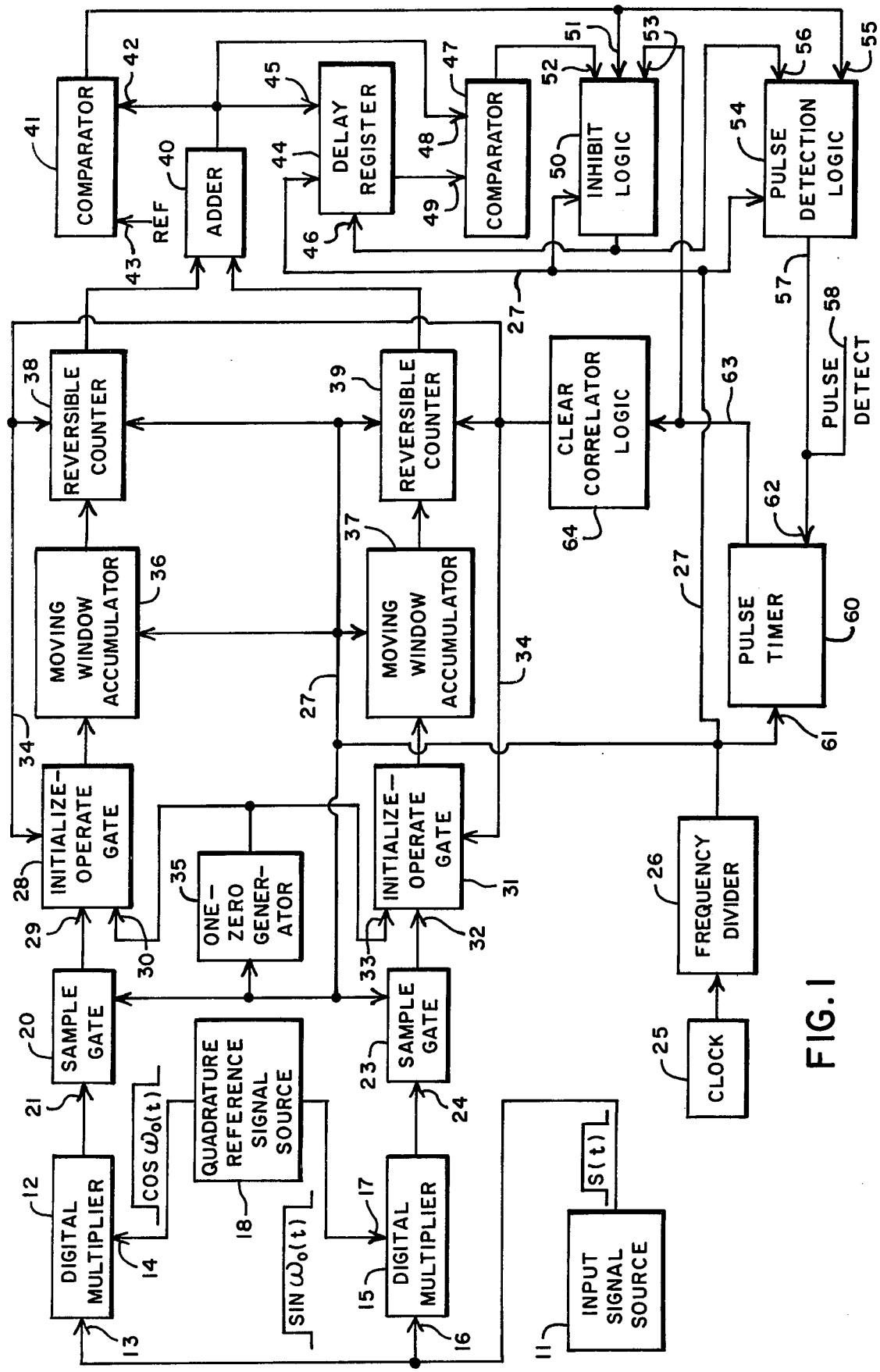
FIG. 1 is a functional block diagram of tone pulse detection apparatus in accordance with the applicant's invention.
Figure 4:
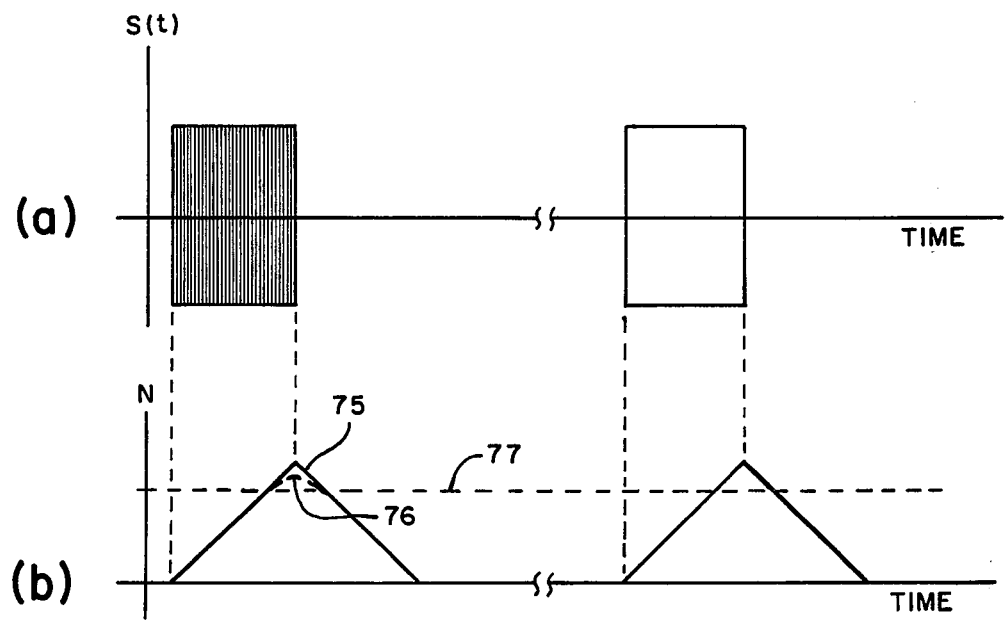
FIG. 4 shows the relationship between an ideal input pulse train and the resulting moving correlation signal.

In the block diagram of FIG. 1, reference numeral 11 identifies an input signal source which supplies a clipped input signal $\lfloor S(t) \rfloor$ to following portions of the tone pulse detector. The clipped input signal may have been derived from a signal received by a transducer, antenna or other signal receiver. The received signal is assumed to include pulses of interest as shown in FIG. 4 (a), and random noise superimposed thereon. The pulses of interest are of a known carrier frequency and pulse duration. They may also occur at a uniform known pulse repetition interval.

Input signal source 11 contains means of which an example is shown in more detail in FIG. 2, for normalizing the amplitude of the received signal by hard limiting or clipping so as to limit the amplitude to a predetermined level. The clipping process preserves the information contained in the zero crossings of the received signal. Accordingly, clipped input signal $\lfloor S(t) \rfloor$ comprises a rectangular waveform having predetermined upper and lower amplitudes. Further, this signal may be conveniently converted into a binary signal compatible with well known digital processing techniques and logic elements. Conversion may be accomplished by simply shifting the signal voltage so that its upper and lower amplitudes correspond to system voltage levels representing binary 1s and 0s. For purposes of the remainder of this description it will be assumed that the upper and lower amplitudes of the clipped input signal are represented by 1s and 0s respectively.

Figure 3:
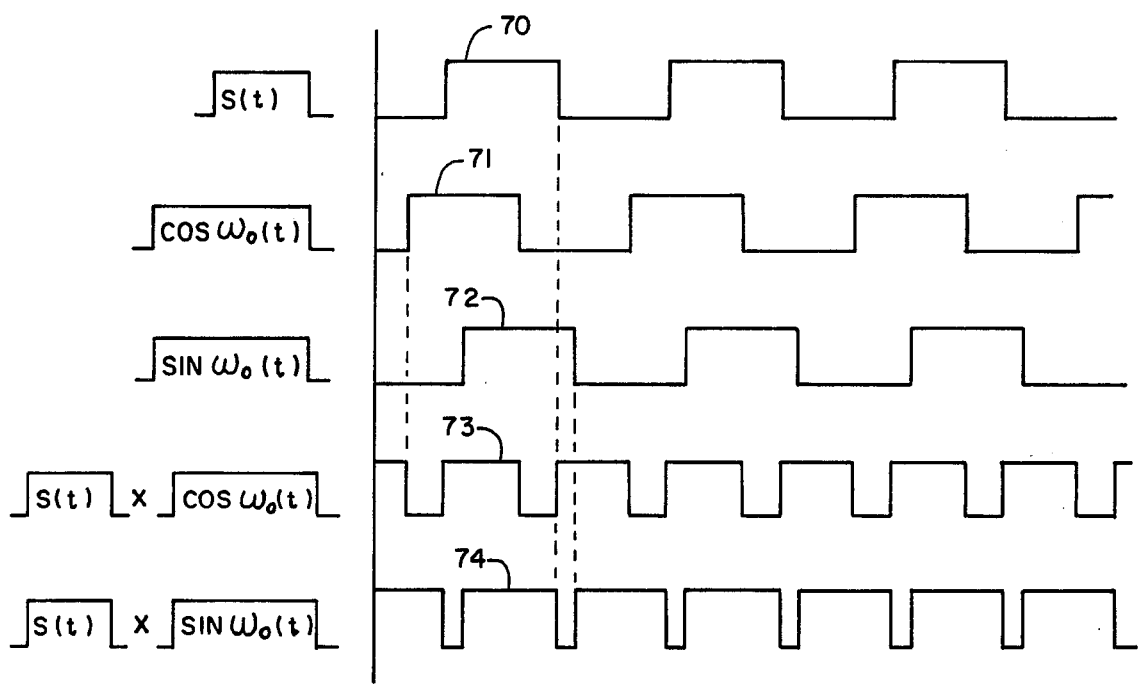
FIG. 3 illustrates waveforms and relative timing of signals at various points in the applicant's tone pulse detection apparatus.

Assuming the ideal case in which no noise is present, clipped input signal $\lfloor S(t) \rfloor$ during receipt of a pulse comprises upper and lower (or binary 1 and 0) portions of uniform duration as shown in FIG. 3, waveform 70. This rectangular wave signal has a repetition rate equal to the signal pulse carrier frequency.

In the more realistic case in which random noise is present, the intervals of clipped input signal $\lfloor S(t) \rfloor$ between pulses comprise a rectangular wave signal in which the upper and lower portions are of random duration. Further, even when a signal pulse is present, if the amplitude of the noise exceeds the pulse amplitude the regularity of the rectangular waveform will be momentarily altered.

Clipped input $\lfloor S(t) \rfloor$ is supplied to a pair of digital multipliers 12 and 15. Multiplier 12 has a first input terminal 13 to which the clipped input signal is supplied, a second input terminal 14 and an output terminal. Similarly, digital multiplier 15 has a first input terminal 16 to which the clipped input signal is supplied, a second input terminal 17 and an output terminal.

Reference numeral 18 identifies a quadrature reference signal source which produces first and second square wave signals $\lfloor \cos \omega_o(t) \rfloor$ and $\lfloor \sin \omega_o(t) \rfloor$. As apparent from the signal functions, these square wave signals are 90° out of phase or in quadrature with one another. They also have a repetition rate equal to the carrier frequency of the signal pulse, and upper and lower values of 1 and 0. The first and second square wave signals may be considered quadrature components of a square wave reference signal.

The first and second square wave signals are supplied to inputs 14 and 17 respectively of digital multipliers 12 and 15. Multipliers 12 and 15 produce first and second product signals comprising rectangular wave signals as illustrated in FIG. 3, waveforms 73 and 74 respectively. Waveforms 73 and 74 are representative of waveforms which would be produced by implementing digital multipliers 12 and 15 with exclusive OR circuits. Such circuits produce a low output only when both inputs have corresponding amplitudes, i.e., both 1 or both 0. It should, however, be noted that the multiplication function may be implemented in a variety of ways which may result in other waveforms. The essential operation is that a characteristic output be produced only when both input signals have corresponding values.

The first and second product signals are supplied to sample gates 20 and 23 respectively. Sample gate 20 has an input terminal 21 connected to receive the first product signal, a control terminal and output terminal. Similarly, sample gate 23 has an input terminal 24 connected to receive the second product signal, a control terminal and an output terminal.

Sample gates 20 and 23 are caused to sample the product signals at a sample rate which is adequate to retain the desired information in the input pulses, and produce first and second sample trains at their respective output terminals. The sampling rate is controlled by a clock 25 and frequency divider 26 which produce a timing pulse train on conductors 27 for timing and synchronizing operations of various portions of the pulse detector. As shown, sample gates 20 and 23 are controlled by timing pulses supplied to their respective control terminals.

The sample trains, which comprise uniformly spaced short duration pulses having values of either 1 or 0, are supplied to gates 28 and 31, each of which is designated in FIG. 1 as an initialize-operate gate. Gate 28 has a first input terminal 29 connected to receive the first sample train, a second input terminal 30, a control terminal and an output terminal. Similarly, gate 31 has a first input terminal 32 connected to receive the second sample train, a second input terminal 33, a control terminal and an output terminal. Each of gates 28 and 31 operates such that an appropriate signal at its control terminal will cause the signal at one of its input terminals to be transmitted to its output terminal.

For purposes of the following description, it may be assumed that gates 28 and 31 each operate such that in the absence of a signal at its control terminal, the sample train at its first input terminal will be transmitted to its output terminal. Conversely, if a signal is present at its control terminal, the signal at its second input terminal will be transmitted to its output terminal. The signals at the control terminals are supplied through conductors 34 from logic circuitry which will hereinafter be described in greater detail. During the actual pulse detection process, no signal is carried on conductors 34, thereby causing the first and second sample trains to be produced at the output terminals of gates 28 and 31 respectively.

The second input terminals of gates 28 and 31 are connected to the output terminal of a one-zero generator 35 which receives timing signals through conductor 27 and produces a train of pulse signals of alternating amplitudes. During periodic initializing of the tone pulse detector, a signal is supplied to the control terminals of gates 28 and 31, whereby the gates produce a pulse train of alternating values having a repetition rate equal to one-half of the sampling rate.

The output signals of gates 28 and 31 are supplied to moving window accumulators 36 and 37 respectively. The moving window accumulators, which may comprise shift registers each having a predetermined number of storage locations, are under the control of the timing signal on conductor 27 and operate to accept the output signals from gates 28 and 31, and shift the signals seriatim to the accumulator output terminals. Accumulators 36 and 37 thus serve to define a window of fixed duration determined by the number of storage locations therein and the rate at which signals are shifted therethrough.

Each of accumulators 36 and 37 has associated therewith logic which produces a signal when the samples entering and leaving the accumulator have different values. Stated otherwise, the logic associated with each shift register produces a signal only when the relative number of 1s and 0s in the shift register is changing. It may further be observed that a change in the relative number of 1s and 0s in each shift register in indicative of a change in the degree of correlation between the pulse detector input signal and one of the quadrature components of the square wave reference signal.

The output signals of accumulators 36 and 37 comprise trains of samples having values of either 1 or 0. These samples are supplied to reversible counters 38 and 39 respectively, each of which has data input terminals means, an enabling terminal, a reset terminal and an output terminal. Counters 38 and 39 produce counts which are incremented or decremented by data signals having first or second values respectively. For example, each counter, when enabled to count, may be considered to operate such that a count therein is advanced by one unit in response to each data signal having a value of 1, and diminished by one unit in response to each data signal having a value of 0.

The enabling signals for the counters are supplied by the previously described logic associated with accumulators 36 and 37. Accordingly, the magnitude of the count in counter 38 is representative of the difference in numbers of samples in accumulator 36 having 1 and 0 values. This count is indicative of the degree of correlation between the pulse detector input signal and the $\int \cos \omega_o(t) \lfloor$ components of the reference signal. Similarly, the magnitude of the count in counter 39 is representative of the difference in the numbers of samples in accumulator 37 and 1 and 0 values. Thus, the count in counter 39 is indicative of the degree of correlation between the input signal and the $\int \sin \omega_o(t) \lfloor$ component of the reference signal.

With reference to operation of accumulators 36 and 37, it may be observed that noise will correlate with the reference signal in a random manner resulting in sample trains of 1s and 0s in random order. Accordingly, the differences in the numbers of 1s and 0s in the accumulators may vary slightly with time, but on the average there will be no net difference in the numbers of 1s and 0s in the accumulators due to noise. Consequently, counters 38 and 39 will respond to noise by maintaining an average count of zero. However, as the input signal commences to contain components which correlate more closely with the reference signal, a predominant number of 1s or 0s will be present in each accumulator. This predominance will be reflected in the counts in the counters.

The counters 38 and 39 are supplied to an adder 40 which adds the counts to produce a moving correlation signal indicative of the degree of correlation between the input signal and the reference signal. In the absence of noise in the input signal the correlation function has a form as shown by solid curve 75 in FIG. 4 (b). It can be seen that as a signal pulse moves into the pulse detection window the correlation function increases linearly to a peak, and as the pulse moves out of the window the correlation function linearly decreases. Noise in the input signal caused the correlation function to become rounded off as shown by dashed curved 76 in FIG. 4 (b). Dashed line 77 represents a correlation threshold above which a correlation level indicates presence of a pulse input signal. Although curves 75 and 76 are shown as smooth lines, it should be pointed out that noise spikes may introduce irregularities in the form of multiple peaks and/or multiple crossings of the correlation threshold which must be dealt with in accurately determining the time of occurrence of a signal pulse.

The moving correlation signal is supplied to a comparator 41 through a first input terminal 42. Comparator 41 also has a second input terminal 43 which is supplied with a reference signal indicative of a correlation threshold representing the minimum degree of correlation chosen to characterize presence of an input pulse.

Comparator 41 compares the signals at input terminals 42 and 43 and produces an output signal when the moving correlation signal exceeds the threshold reference signal.

The moving correlation signal is also supplied to a delay register 44 through an input terminal 45. Delay register 44 has a control terminal 46, a clock terminal and an output terminal. Register 44 receives clock pulses through conductor 27, and is operable to delay by one clock pulse the signal received through input terminal 45 provided an enabling signal is present at control terminal 46. If the enabling signal is present at control terminal 46, the delay signal appears at the output terminal. If an enabling signal is not present at control terminal 46, the last signal at the output terminal is maintained thereat.

The undelayed moving correlation signal and the delayed moving correlation signal as produced by delay register 44 are supplied to a second comparator 47 thorugh input terminals 48 and 49 respectively. Comparator 47 has an output terminal at which a signal is produced indicating whether the undelayed moving correlation signal is larger or smaller than the delayed moving correlation signal, thus detecting peaks in the signal.

Reference numeral 50 indentifies inhibit logic having an input terminal 51 connected to receive the output signal of comparator 41, an input terminal 52 connected to receive the output signal of comparator 47, an input terminal 53 connected to receive a pulse window signal which will hereinafter be described in greater detail and an output terminal which is connected to supply a signal to the control terminal 46 of delay register 44. Inhibit logic 50 functions to provide an output signal which will disable register 44 only during presence of a pulse window signal at input terminal 53 and only when the signals supplied by comparators 41 and 47 respectively indicate that the moving correlation signal exceeds the correlation threshold signal and the undelayed moving correlation signal is smaller than the delayed moving correlation signal. Accordingly, register 44 is caused to detect and hold the maximum correlation signal which occurs during a pulse detection window.

Reference numeral 54 identifies pulse detection logic having an input terminal 55 connected to receive the output signal of comparator 41, an input terminal 56 connected to receive the output signal of inhibit logic 50 and an output terminal 57. Detection logic 54 operates such that after the maximum correlation during a pulse detection window has occured and the moving correlation signal has fallen below the threshold reference, in effect indicating that the input signal pulse is passing out of the pulse detection window, a pulse detection signal is produced at output 57. This pulse detection signal is supplied over conductor 58 to any suitable utilization apparatus. It is also supplied to a pulse timer 60 through an input terminal 62. Timer 60 also has an input terminal 61 connected to receive timing signals from frequency divider 26 through conductors 27.

Timer 60 operates so as to produce a pulse window signal on conductor 63. The pulse window signal has a duration equal to the duration of the pulse detection window, and commences a predetermined length of time after the last detected pulse as indicated by a pulse detection signal at input terminal 62. Conductor 63 supplies the pulse window signal to input terminal 53 of inhibit logic 50, and to logic circuitry 64 designated as clear correlator logic.

Logic circuitry 64 is operable to supply signals to gates 28 and 31 and counters 38 and 39 through conductors 34. It operates such that following detection of an input signal pulse, a signal is supplied to gates 28 and 31 of sufficient duration to cause accumulators 36 and 37 to be filled with alternate 1 and 0 samples through operation one-zero generator 35. The signal from logic circuitry 64 is also supplied to the reset terminals of counters 38 and 39, whereby the counts therein are set to zero. This condition in addition to the existence of identical numbers of 1s and 0s in accumulators 36 and 37 initializes the tone pulse detection so that it is immediately ready to sense correlation between the input signal and the reference signal. It should, however, be noted that if the noise superimposed on the input signal is purely random in nature, the tone pulse detector will tend to maintain initialized conditions following pulse detection without making specific provisions for clearing residual signals from the accumulators and counters.

Figure 2A:
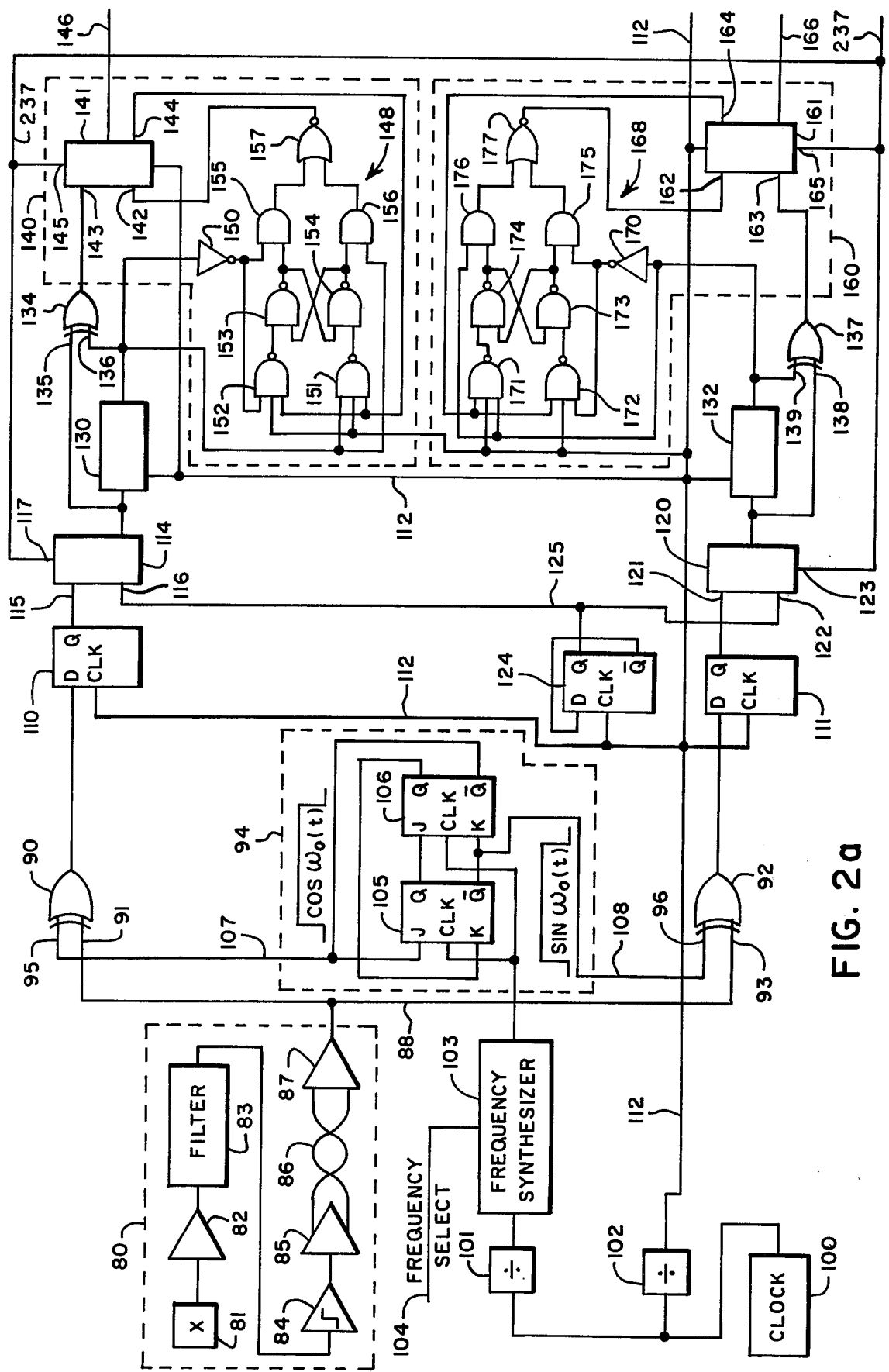
FIG. 2a and 2b together comprise a schematic of the preferred embodiment of the tone pulse detection apparatus of FIG. 1.
Figure 2B:
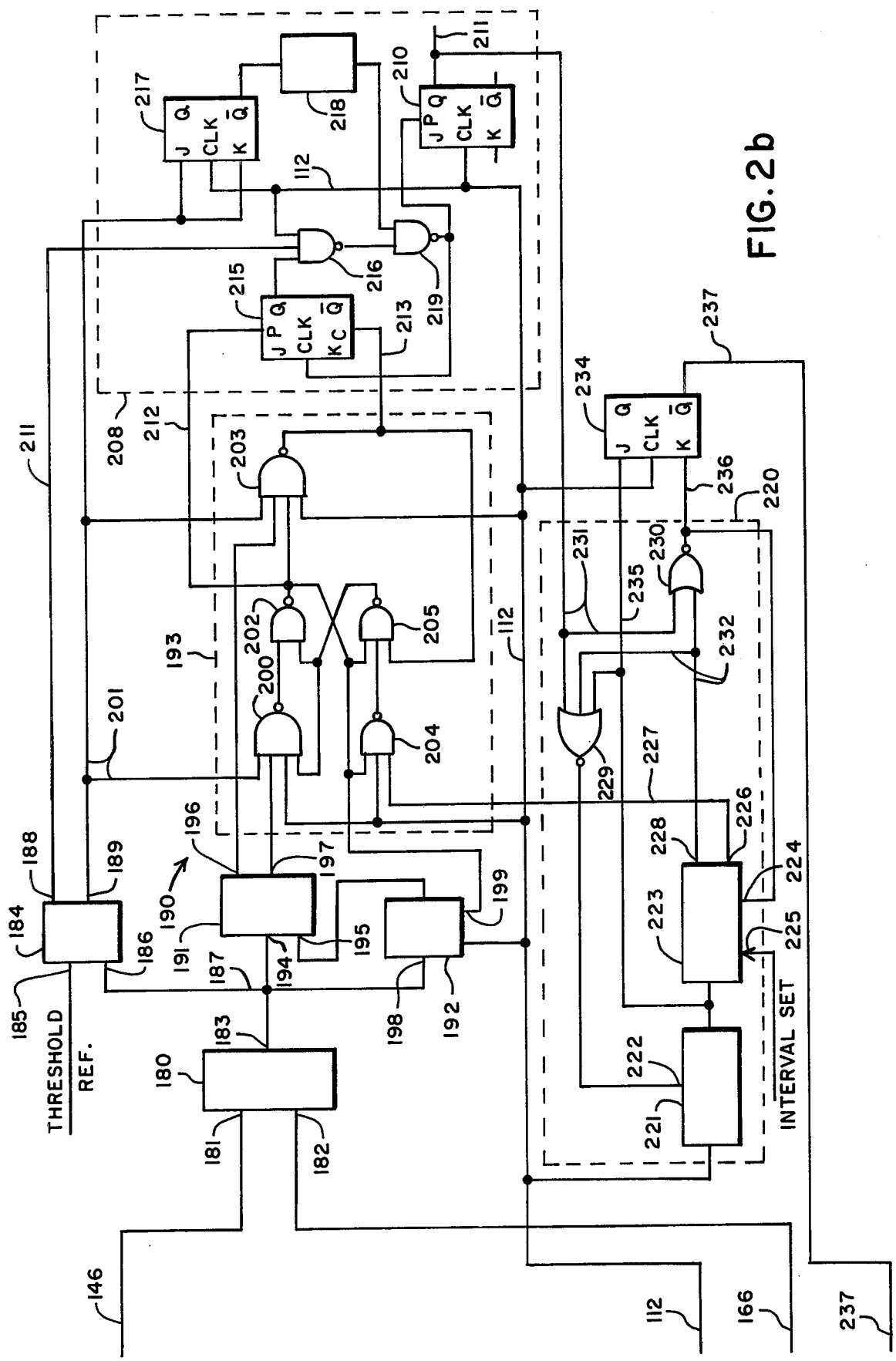

With reference to the schematic diagrams of FIGS. 2a and 2b, reference numeral 80 identifies an input signal source which is shown as comprising a transducer 81, a preamplifier 82, a band pass filter 83, a clipping amplifier 84, a line driver 85, a transmission line 86 and a line receiver 87. Transducer 81, which is shown as a hydrophone, is provided for sensing an input pulse signal comprising tone pulses of a known duration and carrier frequency. Substantial random noise may also be present in the sensed signal. The sensed signal is supplied to preamplifier 82 and then to band pass filter 83 which passes signal frequency components within a frequency band of interest. The filtered signal is hard limited or clipped by means of clipping amplifier 84 to produce a rectangular wave signal having either of two instantaneous amplitudes. The clipped signal is supplied to line driver 85 to be transmitted over transmission line 86 and received by line receiver 87. The output of amplifier 87 may be assumed to be a binary rectangular wave signal having an upper value of 1 and a lower value of 0. This signal is identified as $\_\lceil S(t) \rceil\_$, and a portion thereof resulting from an input pulse has a waveform as shown in FIG. 3, waveform 70. Signal $\_\lceil S(t) \rceil\_$ is supplied to a first exclusive OR circuit 90 through a first input terminal 91 and to a second exclusive OR circuit 92 through a first input terminal 93. Exclusive OR circuits 90 and 92 function as digital multipliers to multiply signal $\_\lceil S(t) \rceil\_$ with quadrature components of a square wave reference signal supplied to second input terminals 95 and 96 of the multipliers.

Reference numeral 94 identifies a reference signal source which generates first and second square wave signals comprising quadrature components $\_\lceil \cos \omega_o(t) \rceil\_$ and $\_\lceil \sin \omega_o(t) \rceil\_$ of a square wave reference signal, as illustrated in FIG. 3, waveforms 71 and 72. Signal source 94 is shown as comprising a pair of cross-coupled JK flip flops 105 and 106 of which the J, Q, K and $\overline{Q}$ terminals of flip flop 105 are connected to the $\overline{Q}$, J, Q and K terminals of flip flop 106 respectively. Square wave signal $\_\lceil \cos \omega_o(t) \rceil\_$ is produced at the junction of the J and $\overline{Q}$ terminals of flip flops 105 and 106 respectively and is supplied to exclusive OR circuit 90 through a conductor 107. Square wave signal $\_\lceil \sin \omega_o(t) \rceil\_$ is produced at the junction of the Q and K terminals of flip flops 105 and 106 respectively, and is supplied to exclusive OR circuit 92 through a conductor 108.

The clock terminals of flip flops 105 and 106 are supplied with a timing pulse train which originates in a clock 100, the repetition rate of whose output signal is reduced as necessary by a divider 101 and supplied to a frequency synthesizer 103. Synthesizer 103 permits setting of the square wave reference signal to any of a plurality of repetion rates so as to permit detection of tone pulse input signals at any of a plurality of desired carrier frequencies. The repetition rate of the timing pulse train supplied by synthesizer 103 may be changed by a frequency selection signal on a conductor 104. Synthesizer 103 may embody any of a number of well known suitable designs. One satisfactory arrangement comprises a programmable divider, error voltage generator and voltage controlled oscillator connected in a phase lock loop. U.S. Pat. No. 3,889,186 issued to R. J. Larson on June 10, 1975 also discloses a digitally implemented second order phase lock loop around which frequency synthesizer 103 may be constructed.

The first and second product signals produced by exclusive OR circuits 90 and 92, as illustrated in FIG. 3, waveforms 73 and 74 respectively, are supplied to the D terminals of edge triggered flip flops 110 and 111 respectively. Flip flops 110 and 111 serve to sample the product signals at a rate determined by a timing signal at clock terminals of the flip flops, and supply sample trains indicative of the amplitudes (either 1 or 0) of the product signals at the sampling instants. As previously indicated, the sampling rate must be adequate to retain the desired information in the tone pulse input signal.

The clock terminals of flip flops 110 and 111 are supplied with a timing pulse train which originates at clock 100. The repetition rate of the timing pulse train is reduced as necessary by a divider 102 and supplied through timing conductors 112 which also supply timing and synchronization signals to various other portions of the tone pulse detector. It should be noted that although a single set of conductors 112 for supplying the clock signals is shown, the tone pulse detector may require timing signals of various phases and/or time delays for optimum operation. Accordingly, divider 102 and conductors 112 represent means for producing timing and synchronization signals as required.

The sample train produced by flip flop 110 is supplied to a first selection gate 114 through a first input terminal 115. Selection gate 114 also has a second input terminal 116, a control terminal 117 and an output terminal. Similarly, the sample train produced by flip flop 111 is supplied to a second selection gate 120 through a first input terminal 121. Gate 120 also has a second input terminal 122, a control terminal 123 and an output terminal.

Gates 114 and 120, which may comprise integrated circuit "AND-OR-INVERT" gates produced by Texas Instruments Inc. and designated by number 74LS51, operate such that if no signal is present at the control terminals, the sample trains at the first input terminals are transmitted to the output terminals. Conversely, if a signal is present at the control terminals, the signals at the second input terminals are transmitted to the output terminals.

The signal at second input terminals 116 and 122 of gates 114 and 120 comprises a 1-0 square wave signal having one half the repetition rate of the clocking signal on the timing conductor 112, and as hereinafter described in greater detail, is utilized to periodically establish initialized conditions in certain portions of the tone pulse detector. The signal supplied to second input terminals 116 and 122 of gates 114 and 120 is produced by an edge triggered flip flop 124 having its clock terminal connected to timing conductor 112 and its Q terminal connected to the gates through a conductor 125.

The output signals of gates 114 and 120 are supplied to the input terminals of shift registers identified by reference numerals 130 and 132 respectively. In one satisfactory embodiment of the applicant's tone pulse detector, shift registers 130 and 132 each provided 768 storage locations through which the sample trains supplied by gates 114 and 120 were respectively shifted seriatim between the shift register input and output terminals. The shifting rate is controlled by the timing pulse train on conductors 112, and is identical to the sampling rate. Shift registers 130 and 132 define a pulse detection window whose duration is dependent on the timing pulse rate and the number of storage locations in the shift registers.

An exclusive OR circuit 134 has first and second input terminals 135 and 136 connected to the input and output terminals of shift register 130 respectively. Similarly, an exclusive OR circuit 137 has input terminals 138 and 139 connected to the input and output terminals of shift register 132 respectively. Exclusive OR circuits 134 and 137 each produce a low output when both input signals thereto are identical, i.e., both 1 or both 0. Accordingly, a low output is produced when a sample being shifted into the associated shift register has the same value as the sample being shifted out. Further, it can be seen that each exclusive OR circuit produces a high output only when the relative number of 1 and 0 samples within the associated shift register is changing.

Reference numeral 140 identifies a first reversible counter means which serves to count the difference in the number of 1 and 0 samples within shift register 130. Counting means 140 comprises a counter 141 having a control terminal 142 for receiving a signal which determines the counting direction (i.e., up or down), an enabling terminal 143 for receiving an enabling signal to permit operation of the counter, a first output terminal 144 for producing a signal when the counter is counting down and the count therein reaches zero, a reset terminal 145 for receiving a signal to reset the count in the counter to zero, a timing terminal for receiving timing pulses which cause the count to be changed by one at each timing pulse, and second output terminal at which is provided a signal indicative of the count in the counter.

Reference numeral 148 generally refers to logic circuitry for controlling the counting direction of counter 141. It comprises an inverter 150, first and second three input NAND circuits 151 and 152, a pair of cross coupled two input NAND circuits 153 and 154, a pair of AND circuits 155 and 156 and a NOR circuit 157. Noninverted and inverted versions of the sample train from shift register 130 are supplied to NAND circuit 151 and AND circuit 156, and to NAND circuit 152 and AND circuit 155 respectively. NAND circuits 151 and 152 are also connected to receive the signal produced at first output terminal 144 of counter 141. The output signals of NAND circuits 151 and 152 are supplied cross coupled NAND circuits 153 and 154 which serve to provide a high signal to only one of the second input terminals of AND circuits 155 and 156 at a time. A high output signal from either AND circuit 155 or 156 is inverted by NOR circuit 157 and supplied to control terminal 142 of counter 141, whereby the counter is caused to count up. Conversely, if the output signals of both AND circuits are low, the counter is caused to count down.

Circuitry 148 and exclusive OR circuit 134 operate in response to the input and output signals of shift register 130 and the signal at terminal 144 of counter 141 such that the count produced by counter 141 on conductors 146 is one half of the difference in numbers of 1 and 0 samples in shift register 130. Specifically, the signal supplied to control terminal 142 of counter 141 is low when the direction of the last previous or currently occurring change in the magnitude of the difference in the numbers of 1 and 0 samples in register 130 is increasing, thus directing the counter to count up. Conversely, the signal supplied to control terminal 142 is high when the direction of the last previous or the current change is decreasing, thus directing the counter to count down.

Three input NAND circuits 151 and 152 sense whether the difference in the number of 1 and 0 samples in register 130 is changing from a greater number of one samples to a greater number of 0 samples, or vise versa. When the number of 0 samples becomes predominant, NAND circuit 151 produces a low output signal. When the number of 1 samples becomes predominant, NAND circuit 152 produces a low output signal.

NAND circuits 153 and 154 are cross coupled to form a two state memory circuit which remembers whether the counter is counting in a direction of a greater number of 1 samples or a greater number of 0 samples. If NAND circuit 151 was the last to produce a low output signal, then the output signal of NAND circuit 154 is high, and the output signal of NAND circuit 153 is low, thus indicating a greater number of 0 samples. If NAND circuit 152 was the last to produce a low output signal, then the output signal of NAND circuits 153 is high, and the output signal of NAND circuits 154 is low, thus indicating a greater number of 1 samples. AND circuits 155 and 156 and NOR circuit 157 logically decide on the basis of the logic state of the memory circuit and the output signal of shift register 130 whether counter 141 should count up or down. If the last change in the difference in numbers of 1 and 0 samples was in the direction of a greater number of 1 samples, and a 0 sample is present at the output terminal of shift register 130, then the output signal of AND circuit 155 is high, forcing the output signal of NOR circuit 157 to become low, and directing counter 141 to count up. Similarly, if the last change was to a greater number of 0 samples and a 1 sample is present at the output terminal of shift register 130, then the output signal of AND circuit 156 is high and a count up command again results. Conversely, a greater number of 0 samples and a 1 sample at the output terminal of shift register 130, or a greater number of 0 samples and a 0 sample at the shift register output terminal results in a count down command. Accordingly, it can be seen that the output count of counter 141, as produced on conductors 146, represents the magnitude of the difference in numbers of 1 and 0 samples in shift register 130.

Reference numeral 160 identifies a second reversible counting means identical to reversible counting means 140. Reversible counting means 160 serves to count the difference in the numbers of 1 and 0 samples within shift register 132. Counting means 160 comprises a counter 161 having a control terminal 162, an enabling input terminal 163, a first output terminal 164, a reset terminal 165, a timing terminal and a second output terminal connected to conductors 166. Control terminal 162 is connected to receive a signal from logic circuitry 168 which controls the counting direction of counter 161. Circuitry 168 is identical to circuitry 148 and comprises an inverter 170, first and second three input NAND circuits 171 and 172, a pair of cross-coupled two input NAND circuits 173 and 174, a pair of two input AND circuits 175 and 176 and a NOR circuit 177. Components 170 through 177 are interconnected and operate as described for circuitry 148. Accordingly, counter 161 produces an output count on conductors 166 indicative of the difference in numbers of 1 and 0 samples in shift register 132.

The counts on conductors 146 and 166 are supplied to an adder 180 through input terminals 181 and 182. Adder 180, which may be implemented with commercially available integrated circuit adders produced by Texas Instruments, Inc. and designated by number 74LS283, produces a signal at output terminal 183 indicative of the sum of the counts on conductors 146 and 166. This signal comprises a moving correlation signal indicative of the degree of correlation between the pulse detector input signal and the sqaure wave reference signal. It is representative of the correlation function illustrated in FIG. 4(b).

The moving correlation signal is supplied to a first comparator 184 which has a first input terminal 185 for receiving a reference signal indicative of a correlation threshold, a second input terminal 186 connected by means of conductors 187 to receive the moving correlation signal, a first output terminal 188 at which is produced a signal when the moving correlation signal is less than the threshold reference signal and a second output terminal 189 at which is produced a signal when the moving correlation signal is greater than the threshold reference signal. Accordingly, the signal at output terminals 188 and 189 comprise a pulse indication signal since it indicates a degree of correlation greater than the correlation threshold.

The moving correlation signal is also supplied to a second comparator 191 and a delay register 192. Comparator 191 has a first input terminal 194 connected to receive the moving correlation signal, a second input terminal 195 connected to receive the output signal from delay register 192, and first and second output terminals 196 and 197 at which are produced signals when the moving correlation signal is respectively greater than or less than the signal received from delay register 192. Comparators 184 and 191 may be implemented with commercially available integrated circuits produced by Texas Instruments, Inc. and designated by number 74LS85.

Delay register 192 has an input terminal 198 connected to receive the moving correlation signal, an output terminal connected to input terminal 195 of comparator 191, a timing terminal and a control terminal 199. Delay register 192 operates such that if no signal is present at control terminal 199, the input signal is delayed by one timing pulse before being produced at the output terminal. If a signal is supplied to control terminal 199, the last previous signal remains at the output terminal. Accordingly, delay register 192 functions to detect and hold the maximum peak in the moving correlation signal. The signals at output terminals 196 and 197 of comparator 191 comprise peak detection signals indicative of peaks in the moving correlation function.

Reference numeral 193 identifies inhibit logic ciruitry for supplying signals to control terminal 199 of delay register 192. Circuitry 193 comprises a first four input NAND circuit 200, a two input NAND circuit 202, a second four input NAND circuit 203 and a pair of three input NAND circuits 204 and 205. A first input of NAND circuit 200 is connected by a conductor 201 to receive the signal from output terminal 189 of comparator 184. A second input of NAND circuit 200 is connected to receive the signal from output terminal 197 of comparator 191. A third input terminal is connected to receive the timing signal, and the fourth input terminal is connected to receive a signal from NAND circuit 205 which is cross coupled with NAND circuit 202 so that their output signals are of opposite states. NAND circuit 204 has a first input terminal connected to receive a signal from NAND circuit 202, a second input terminal connected to receive the timing signal and a third input terminal connected to receive a pulse window signal as will hereinafter be described in greater detail.

NAND circuit 203 has a first input connected to receive the signal from output terminal 189 of comparator 184, a second input terminal connected to receive the signal from output terminal 196 of comparator 191, a third input terminal connected to receive the output signal from NAND circuit 202 and a fourth input terminal connected to receive the timing signal.

Inhibit logic circuitry 193 functions as follows to supply an inhibiting signal to control terminal 199 of delay register 192 upon occurrence of peaks in the moving correlation signal during a pulse detection window. Assuming that correlation is sufficient to cause the moving correlation signal to exceed the correlation threshold, a high signal will be supplied from output terminal 189 of comparator 184 to NAND circuits 200 and 203. When a peak in the moving correlation signal is detected as indicated by a high signal at output terminal 197 of comparator 191, all input signals to NAND circuit 200 are high, thus causing it to produce a low output signal and NAND circuit 202 to produce a high output signal. The output signal of NAND 202 is supplied to the control terminal 199 of delay register 192, thus causing the delay register to maintain the last previous signal at its output terminal.

Reference numeral 208 identifies pulse detection logic circuitry including a first JK flip flop 210 which produces a pulse detection signal on conductor 211 in response to signals supplied to circuitry 208 through conductors 212 and 213. More specifically, a second JK flip flop 215 has a preset terminal connected by conductor 212 to receive the output signal of NAND circuit 202 and a clear terminal connected by conductor 213 to receive the output signal of NAND circuit 203. Detection circuitry 208 also comprises a three input NAND circuit 216, a third JK flip flop 217, a one shot circuit 218 and a two input NAND circuit 219.

A signal at the preset terminal of flip flop 215 causes a high output on the Q terminal thereof which is supplied to one input of NAND circuit 216. Other inputs to NAND circuit 216 include a signal from output terminal 188 of comparator 184 indicating that the moving correlation signal exceeds the threshold reference and a timing signal. A high output at the Q terminal of flip flop 215 indicates that a peak has been detected and is being held in delay register 192. Simultaneous occurrence of this peak detection flag and a signal indicating that the moving correlation signal has fallen below the threshold, thus indicating that the pulse is moving out of the pulse detection window cause a low output from NAND circuit 216. However, NAND circuit 219 is prevented from supplying a preset signal to flip flop 210 for a short period of time by operation of flip flop 217 and one shot circuit 218. The purpose of this short delay is to prevent spurious indications of pulse detection which may result from momentary high noise conditions in the input signal. If the low output from NAND circuit 216 remains after expiration of the short time period, indicating detection of a true tone pulse, a present signal causes a high output at the Q terminal of flip flop 210. This signal is supplied on conductor 211 as a pulse detection signal.

The pulse detection signal is supplied to a pulse timer circuit 220 comprising first and second counters 221 and 223 connected in series. Counter 221 has a reset terminal 222, an input terminal connected to receive the timing signals and an output terminal. Counter 223 has a reset terminal 224, a terminal 225 for receiving a signal to set a timing interval, an input terminal connected to the output terminal of counter 221, a first output terminal 226 at which the previously mentioned pulse window signal periodically produced and transmitted NAND circuit 204 over conductor 227, and a second output terminal at which is produced a signal following expiration of each pulse detection window. Counters 221 and 223 may comprise commercially available counters produced by Texas Instruments, Inc. and designated by number 74LS163. Pulse timer circuit 220 also comprises a three input NOR circuit 229 and a two input NOR circuit 230.

Counter 221 and NOR circuit 229 together function as follows to produce a timing pulse train lower repetition rate than the timing signal on conductors 112. Circuit 221 receives a timing signal through conductor 112 and produces an output signal after a predetermined number of timing pulses. This output signal causes the output signal of NOR circuit 229 to change state which resets counter 221 and initiates a new counting cycle. Counter 221 may also be reset by detection of a pulse as indicated by a signal on conductor 231, or by a signal produced at output terminal 228 of counter 223.

The timing pulse train produced by counter 221 is further divided by means of counter 223, with the dividing factor set by an interval set signal at control terminal 225. Following detection of a pulse, counter 223 times an interval as set by the signal at control terminal 225, and then produces a pulse window signal on terminal 226. The duration of the pulse window signal is equal to the duration of the pulse detection window. After the pulse window signal has terminated, a signal is supplied from output terminal 228 to NOR circuits 229 and 230 through conductors 232. As previously indicated, this signal resets counter 221, thus synchronizing its operation with termination of the pulse window signal. Counter 223 is reset by either a pulse detection signal or the signal indicating termination of a pulse detection window, as supplied through NOR circuit 230.

The output signal of NOR circuit 230 is supplied through conductor 236 to the K terminal of a flip flop 234 which functions to supply a clear correlator signal for establishing initialized conditions in shift registers 130 and 132 and counters 141 and 161. A high signal supplied to the k terminal of flip flop 234 causes a high signal to be produced at the $\overline{Q}$ terminal. This signal is supplied through conductors 237 to control terminals 117 and 123 of gates 114 and 120 respectively, and to reset terminals 145 and 165 of counters 141 and 161 respectively, thereby causing the shift rigister to be filled with alternate 1s and 0s and the counts in counters 141 and 161 to be set to 0. The correlator signal is removed from $\overline{Q}$ terminal of flip flop 234 by the output signal of counter 221 which is supplied to the J terminal of the flip flop through conductor 235.

In summary, the pulse detection apparatus described in detail in the foregoing description produces first and second sample trains indicative of whether or not a clipped version of an input signal has instantaneous values which correspond to the values of each of quadrature components of a reference signal. The sample trains are passed through shift registers which in effect form moving windows through which the predetermined number of samples of each of the sample trains can be examined. the difference in number of samples of noncorresponding values in each of the shift registers in counted and summed to provide a moving correlation signal which initially increases and then decreases as a pulse moves into and out of the window. The moving correlation signal is examined both as to whether its magnitude exceeds the correlation threshold indicative of presence of a pulse and whether a maximum peak in the moving correlation signal as occurred.

Although a preferred embodiment of the applicant's unique pulse detection apparatus has been illustrated and described in detail, numerous variations and alternate embodiments within the applicant's contemplation and teaching will be apparent to those skilled in the art. The scope of coverage sought on this invention is not to be limited to the disclosed embodiment, but only by the terms of the appended claims.

The embodiments of the invention in which an exclusive property or right is claimed are defined as follows:

1. Pulse detection apparatus for detecting tone pulses of a known duration and carrier frequency in a signal in which random noise is present, comprising in combination:

input means for supplying an input signal in which tone pulses are to be detected;

clipping means for hard limiting the input signal to produce a clipped signal having either of two instantaneous amplitudes;

a reference signal source for generating first and second square wave signals comprising quadrature components of a square wave reference signal having a repetition rate equal to said carrier frequency and either of two instantaneous amplitudes substantially equal to those of the clipped signal;

first and second digital multiplication means for multiplying the clipped signal and each of the first and second square wave signals to produce first and second product signals respectively, each having a first value when the instantaneous amplitudes of its multiplicand signals are substantially equal and a second value when the instantaneous amplitudes of its multiplicand signals are different;

sampling means for sampling the first and second product signals at a sampling rate adequate to retain the desired information in the input signal to provide first and second sample trains respectively;

a first shift register having an input terminal connected to receive the first sample train, an output terminal for subsequently supplying the first sample train, and a predetermined number of storage locations through which samples are shifted seriatim at said sampling rate between the input and output terminals;

a first reversible counter having a data input terminal connected to receive the first sample train from said first shift register, and an enabling terminal for receiving a signal to permit counting in response to samples received at the data input terminal, said first reversible counter being operable to count in one sense in response to samples having said first value, and operable to count in the opposite sense in response to samples having said second value, so as to produce a first count indicative of the difference between the numbers of samples in said first shift register having first and second values;

first enabling means operable to supply a signal to the enabling terminal of said first reversible counter only when the values of the samples at the input and output terminals of said first shift register means are different;

a second shift register having an input terminal connected to receive the second sample train, an output terminal for subsequently supplying the second sample train, and a predetermined number of storage locations through which samples are shifted seriatim at said sampling rate between the input and output terminals;

second reversible counted means having a data input terminal connected to receive the second sample train from said second shift register, and an enabling terminal for receiving a signal to permit counting in response to signals received at the data input terminal, said second reversible counter being operable to count in one sense in response to samples having said first value, and operable to count in the opposite sense in response to samples having said second value, so as to produce a second count indicative of the difference between the numbers of samples in said second shift register having first and second values;

second enabling means operable to supply a signal to the enabling terminal of said second reversible counter only when the values of the samples at the input and output terminals of said second shift register are different;

an adder for adding the first and second counts to produce a moving correlation signal indicative of degree of correlation between the input signal and the square wave reference signal; and a first comparator for comparing the moving correlation signal with a threshold reference signal indicative of a correlation threshold, and producing a pulse indication signal when the moving correlation signal indicates correlation greater than the correlation threshold.

2. The pulse detection apparatus of claim 1 including:

peak detection means operable to compare values of moving correlation signals which occur during a pulse detection window of fixed duration and exceed the threshold reference signal, said pulse detection means being operable to produce peak detection signals in response to peaks in the moving correlation signal during a pulse detection window; and pulse detection means connected to receive the pulse indication and peak detection signals, and operable to generate a pulse detection signal after receipt of a peak detection signal and in response to disappearance of the pulse indication signal.

3. Pulse detection apparatus of claim 2 wherein said peak detection means comprises.

a second comparator for comparing signals at first and second input terminals thereof, said second comparator being operable to produce first or second output signals when the signal at the first input terminal thereof is respectively greater or smaller than the signal at the second input terminal thereof;

a delay register having input and output terminals and a control terminal, said delay register being operable to delay by one sampling period signals supplied to its input terminal and produce the delayed signals at its output terminal in response to an enabling signal at the control terminal, and to maintain the last transmitted signal at the output terminal in response to an inhibiting signal at the control terminal;

means for supplying the moving correlation signal to the first input terminal of said second comparator and the input terminal of said delay register;

means connecting the output terminal of said delay register to the second input terminal of said second comparator, whereby first and second output signals are produced when the underlayed moving correlation signal is respectively greater or smaller than the delayed moving correlation signal; and inhibit logic means connected to receive the first and second output signals of said comparator and the pulse indication signal, and operable to supply an inhibiting signal to the control terminal of said delay register in response to presence of the pulse indication signal and first and second output signals of said second comparator indicating that the delayed moving correlation signal is smaller than the delayed moving correlation signal.

4. The pulse detection apparatus of claim 3 including:

a pulse timer having a reset input terminal for receiving a signal to initiate a timing cycle and a first output terminal at which pulse window signal having a maximum duration equal to the duration of the pulse detection window is initiated a predetermined length of time after receipt of a signal at the reset terminal;

means for supplying the pulse detection signal to the reset terminal of said pulse timer, whereby a pulse window signal is produced a predetermined length of time after the last detected pulse;

means including a detection window input terminal in said inhibit logic means operable to permit supplying of the inhibiting signal to the control terminal of said delay register only during receipt of a signal at the detection window input terminal; and means connecting the first output terminal of said pulse timer to the detection window input terminal of said inhibit logic means, whereby said inhibit logic means causes said delay register to maintain the last transmitted signal at the output terminal thereof only during pulse detection windows.

5. The pulse detection apparatus of claim 4 including:

a clearing terminal on each of said first and second reversible counters for receiving a clearing signal which establishes a predetermined initial count therein;

a generator for producing a binary signal having a repetition rate equal to one half of the said sampling rate and alternate values corresponding to the first and second values of said product signals;

first and second gate means respectively having first input terminals connected to receive the sample trains, second input terminals connected to receive the binary signal, output terminals respectively connected to the input terminals of said first and second shift registers and control terminals for receiving a clearing signal, said first and second gate means each being operable to transmit the sample train from its input terminal to its output terminal when a clearing signal is absent, and to transmit the binary signal to its output terminal when a clearing signal is present;

clearing logic for producing a clearing signal following termination of the pulse window signal; and means for supplying the clearing signal to the control terminals of said first and second gates and the clearing terminals on said first and second reversible counters.

6. The pulse detection apparatus of claim 2 wherein said pulse detection means includes means for permitting generation of the pulse detection signal only after the pulse indication signal has been present for a predetermined interval of time, whereby false pulse detection signals resulting from spurious indications of correlation above the correlation threshold are prevented.

7. Pulse detection apparatus for detecting a tone pulse of known carrier frequency in a signal in which random noise is present, comprising in combination:

input means for supplying an input signal in which a tone pulse is to be detected.

clipping means for hard limiting the input signal to produce a clipped signal having either of upper and lower instantaneous amplitudes;

a reference signal generator for providing first and second square wave signals each having a repetition rate equal to the carrier frequency, a quadrature phase relationship to one another, and either of upper and lower instantaneous amplitudes, the first and second square wave signals corresponding to a square wave reference signal;

digital multiplication means for multiplying the clipped signal and each of the first and second square wave signals to produce first and second product signals respectively, each having a first value when its multiplicand signals having corresponding instantaneous amplitudes, and a second value when its multiplicand signals have different instantaneous amplitudes;

sampling means for sampling the first and second product signals at a sampling rate adequate to retain the desired information in the input signal to provide first and second sample trains;

moving window counter means operable to produce a moving correlation signal indicative of the sum of the differences of the numbers of samples having uppper and lower values in each of the first and second sample trains during a moving time interval of predetermined duration, the moving correlation signal being indicative of the degree of correlation between the input signal and the square wave reference signal; and first comparator means for comparing the moving correlation signal with a threshold reference signal indicative of a correlation threshold, and producing a pulse indication signal when the moving correlation signal indicates correlation greater than the correlation threshold.

8. The pulse detection apparatus of claim 7 wherein said moving window counter means comprises:

first and second reversible counters, each having data input terminal means for receiving binary data signals and an enabling terminal for receiving a signal to permit counting of the binary data signals, the sense in which counting occurs depending on the value of each data bit;

first and second shift registers having input terminals connected to receive the first and second sample trains respectively, and each capable of holding a predetermined number of samples and shifting the samples seriatim to an output terminal thereof at the sampling rate of said sampling means;

means connecting the output terminals of said first and second shift registers to the data input terminal means of said first and second reversible counters respectively;

means for providing signals to the enabling terminals of said first and second reversible counters only when the values of the samples at the input and output terminals of the shift registers respectively connected thereto are different, whereby the count in each counter is indicative of the difference in the number of samples having upper and lower values in one of said first and second shift registers; and an adder for adding the counts in said first and second reversible counters to produce the moving correlation signal.

9. The pulse detection apparatus of claim 8 including:

peak detection means for producing a peak detection signal in response to peaks in the pulse indication signal; and pulse detection means connected to receive the pulse indication and peak detection signals, and operable to generate a pulse detection signal in response to the maximum peak in the moving correlation signal during a pulse detection window of predetermined duration.

10. The pulse detection apparatus of claim 9 including:

a pulse timer connected to receive the pulse detection signal and operable to produce a pulse window signal having a maximum duration equal to the duration of the pulse detection window commencing a predetermined length of time after the last detected pulse; and peak detection means responsive to the pulse window signals to permit generation of a peak detection signal only when a pulse window signal is present.

11. A method of detecting a tone pulse of known carrier frequency in an input signal in which random noise is present, comprising the steps of:

hard limiting the input signal to produce a clipped signal having either of upper and lower instantaneous amplitudes;

generating first and second quadrature related square wave signals having a repetition rate equal to the carrier frequency and either of upper and lower instantaneous amplitudes, said first and second square wave signals corresponding to a pulse reference signal;

multiplying the clipped signal and each of the square wave signals to produce first and second product signals respectively, each having a first value when its multiplicand signals have corresponding instantaneous amplitudes, and a second value when its multiplicand signals have different instantaneous amplitudes;

sampling the first and second product signals at a sampling rate. Adequate to retain the desired information in the input signal to produce first and second sample trains;

counting the differences in numbers of samples having first and second values in each of the first and second sample trains during a moving time interval or predetermined duration;

adding the differences to produce a moving correlation signal indicative of the degree of correlation between the input signal and the pulse reference signal;

comparing the moving correlation signal with a threshold reference signal indicative of a correlation threshold; and producing a pulse indication when the moving correlation signal indicates correlation greater than the correlation threshold.

12. The method of claim 11 for detecting periodic tone pulses in the input signal, comprising the further steps of:

generating a periodic pulse detection window of predetermined duration having a repetition rate equal to the repetition rate of the tone pulses;

synchronizing the pulse detection windows with the tone pulses;

detecting the maximum peak in the moving correlation signal in excess of the correlation threshold during each window; and producing a pulse detection signal in response to said maximum peak in the moving correlation signal.

* * * * *

UNITED STATES PATENT OFFICE
CERTIFICATE OF CORRECTION

Patent No. 4,038,540  Dated July 26, 1977

Inventor(s) JAMES L. ROBERTS

It is certified that error appears in the above-identified patent and that said Letters Patent are hereby corrected as shown below:

IN THE SPECIFICATION

Column 2, line 26, after " "a " insert -- band- --;

Column 2, line 43, after "making" insert -- highly --.

Column 4, line 28, after "input" insert --signal--.

Column 6, line 24, cancel "and" (first occurrence) and substitute --having--;

line 43, after "The" insert --counts in--.

Column 14, line 27, after "train" insert --of--;

line 65, after "The" insert --clear--.

IN THE CLAIMS

Claim 1, column 16, line 19, cancel "counted" and substitute

--counter--.

UNITED STATES PATENT OFFICE
CERTIFICATE OF CORRECTION

Patent No. 4,038,540  Dated July 26, 1977

Inventor(s) JAMES L. ROBERTS

It is certified that error appears in the above-identified patent and that said Letters Patent are hereby corrected as shown below:

(IN THE CLAIMS continued)

Claim 4, line 4, after "which" insert --a--.

Claim 7, line 20, cancel "having" and substitute --have--.

Signed and Sealed this

Twenty-ninth Day of November 1977

[SEAL]

Attest:

RUTH C. MASON  
Attesting Officer

LUTRELLE F. PARKER  
Acting Commissioner of Patents and Trademarks